(12) United States Patent
Okuma et al.

(10) Patent No.: US 11,054,285 B2
(45) Date of Patent: Jul. 6, 2021

(54) PINCHING SENSOR AND DETECTION DEVICE

(71) Applicant: HITACHI METALS, LTD., Tokyo (JP)

(72) Inventors: Yasuyuki Okuma, Tokyo (JP); Masaru Kokubo, Tokyo (JP)

(73) Assignee: HITACHI METALS, LTD., Tokyo (JP)

(*) Notice: Subject to any disclaimer, the term of this patent is extended or adjusted under 35 U.S.C. 154(b) by 185 days.

(21) Appl. No.: 16/523,379

(22) Filed: Jul. 26, 2019

(65) Prior Publication Data

US 2020/0033162 A1 Jan. 30, 2020

(30) Foreign Application Priority Data

Jul. 27, 2018 (JP) .............................. JP2018-141246

(51) Int. Cl.
*G01D 5/24* (2006.01)
*G01D 5/243* (2006.01)
(Continued)

(52) U.S. Cl.
CPC .......... *G01D 5/2405* (2013.01); *G01D 5/243* (2013.01); *G01R 27/2605* (2013.01); *H01B 3/004* (2013.01)

(58) Field of Classification Search
CPC ........ G01R 27/00; G01R 27/02; G01R 27/26; G01R 27/2605; G01D 5/00; G01D 5/12; G01D 5/14; G01D 5/24; G01D 5/2405; G01D 5/243; G01V 3/00; G01V 3/08; G01V 3/088; H01B 3/00; H01B 3/002; H01B 3/004; G01L 1/00; G01L 1/14; G01L 1/142; G01L 1/144; G01L 1/25; G01L 1/255; E05F 15/00; E05F 15/40; E05F 15/41; E05F 15/44; E05F 15/443; E05F 15/46
USPC .......... 324/600, 649, 658, 686, 705; 73/862, 73/862.381, 862.391, 862.621, 862.68; 200/61.42, 61.43, 61.44, 61.71, 61.73, 200/502, 511; 49/26, 28
See application file for complete search history.

(56) References Cited

U.S. PATENT DOCUMENTS 9,078,570 B2 * 7/2015 Parks ................... A61B 5/6852
2008/0088157 A1 * 4/2008 Chen ..................... B62D 25/06
296/209

(Continued)

FOREIGN PATENT DOCUMENTS

JP 2009-085961 A 4/2009
JP 2010-271088 A 12/2010
JP 2011-073636 A 4/2011

*Primary Examiner* — Hoai-An D. Nguyen
(74) *Attorney, Agent, or Firm* — Volpe Koenig (57) ABSTRACT

A detection device has a pinching sensor and a detecting unit. The pinching sensor has a dielectric layer in which a linear conductor layer is formed, and conductor layers arranged on top and bottom surfaces of the dielectric layer, a slit being formed on at least one of the conductor layers arranged on the top and bottom surfaces. The detecting unit supplies a high-frequency signal to an input portion of the linear conductor layer, generates an electric field around a slit portion of the conductor layer on which the slit is formed, and detects a change in a reflection coefficient at the input portion, the change being caused by a change of the electric field generated by interference with a detected object.

12 Claims, 8 Drawing Sheets

(51) Int. Cl.
  *G01R 27/26* (2006.01)
  *H01B 3/00* (2006.01)

(56) References Cited

U.S. PATENT DOCUMENTS

2009/0178343 A1* 7/2009 Zimmer .................. B60J 10/00
  49/475.1
2012/0125078 A1* 5/2012 Iott ....................... E05F 15/443
  73/1.82

* cited by examiner

FIG. 12 ical Field of the Invention

PINCHING SENSOR AND DETECTION DEVICE

CROSS-REFERENCE TO RELATED APPLICATION

The present application claims priority from Japanese Patent Application No. 2018-141246 filed on Jul. 27, 2018, the content of which is hereby incorporated by reference into this application.

TECHNICAL FIELD OF THE INVENTION

The present invention relates to a pinching sensor and a detection device, for example, a pinching sensor and a detection device mounted on a vehicle such as an automobile.

BACKGROUND OF THE INVENTION

Recently, a system having a slide type opening/closing body such as a power sliding door of a vehicle or a generally automatic door demands a detection device for preventing a detected object such as a human body from being pinched. For example, Patent Document 1 (Japanese Patent Application Laid-open No. 2011-73636) and Patent Document 2 (Japanese Patent Application Laid-open No. 2009-85961) each disclose such a detection device. Patent Document 1 discloses a sensitive type sensor detecting a variation in resistance values etc. of a pinching sensor that is subjected to any stress (pressure) due to a detected object contacting with the pinching sensor. Further, Patent Document 2 discloses a capacitive type sensor in which a pinching sensor has a capacity detected conductor portion and detects a capacitive variation due to a parasitic capacity generated between the capacity detected conductor portion and the detected object. Incidentally, Patent Document 3 (Japanese Patent Application Laid-open No. 2010-271088) discloses no detection device for preventing an object from being pinched, but discloses a distance measuring device obtaining a distance to the object by using radio waves.

SUMMARY OF THE INVENTION

In a case of the sensitive type sensor, the detection is made after the stress is caused, so that the object leads to being detected after being pinched by the opening/closing body. Meanwhile, in a case of the capacitive type sensor, the object can be detected before being subjected to the stress. However, if a detected element is elongated for widely performing the detection, capacity itself of the capacity detected conductor portion is increased in value and the parasitic capacity with the detected object has a relatively small value, which brings a problem of making it difficult to detect the capacitive variation.

An object of the present invention is to provide a pinching sensor and a detection device, which are widely detectable and can detect a detected object before the pinching senor is subjected to any stress.

The above and other objects and novel characteristics of the present invention will be apparent from the description of the present specification and the accompanying drawings.

The following is a brief description of an outline of the typical invention disclosed in the present application.

That is, a detection device includes a detected element and a detecting unit. The detected element has: a dielectric layer on which a linear conductor layer is formed; and conductor layers arranged on top and bottom surfaces of the dielectric layer, and has a transmission channel in which a slit is formed on at least one of the conductor layers arranged on the top and bottom surfaces. Further, the detecting unit supplies a high-frequency signal to an input portion of the linear conductor layer, generates an electric field around a slit portion of the conductor layer on which the slit is formed, and detects a change in reflection coefficients of the input portion, the change being caused by a change in electric fields generated by interference with (of) a detected object.

The detected objection interferes with the electric field generated around the slit portion, and the electric field changes by the interference, which brings the change in the reflection coefficients at the input portion of the linear conductor layer. The change in the reflection coefficients makes it possible to detect the detected object before any stress is applied thereto by detecting proximity to or contact with the detected object. Further, the detected element is a transmission channel whose basic structure is a stripline structure, so that elongating the transmission channel has a less influence to the reflection coefficient at the input portion. This makes it possible to detect a wide area (range) in a non-contact state.

The effects obtained by typical embodiments of the invention disclosed in the present application will be briefly described below.

Provided are a pinching sensor and a detection device, which are widely detectable and can detect the detected object before the pinching sensor is subjected to the stress.

DESCRIPTIONS OF THE PREFERRED EMBODIMENTS

Hereinafter, embodiments of the present invention will be described in detail with reference to the accompanying drawings. Note that components having the same function are denoted by the same reference characters throughout the drawings for describing the embodiments, and the repetitive description thereof will be omitted.

First Embodiment

<Outline of Detection Device>

Figure 1:
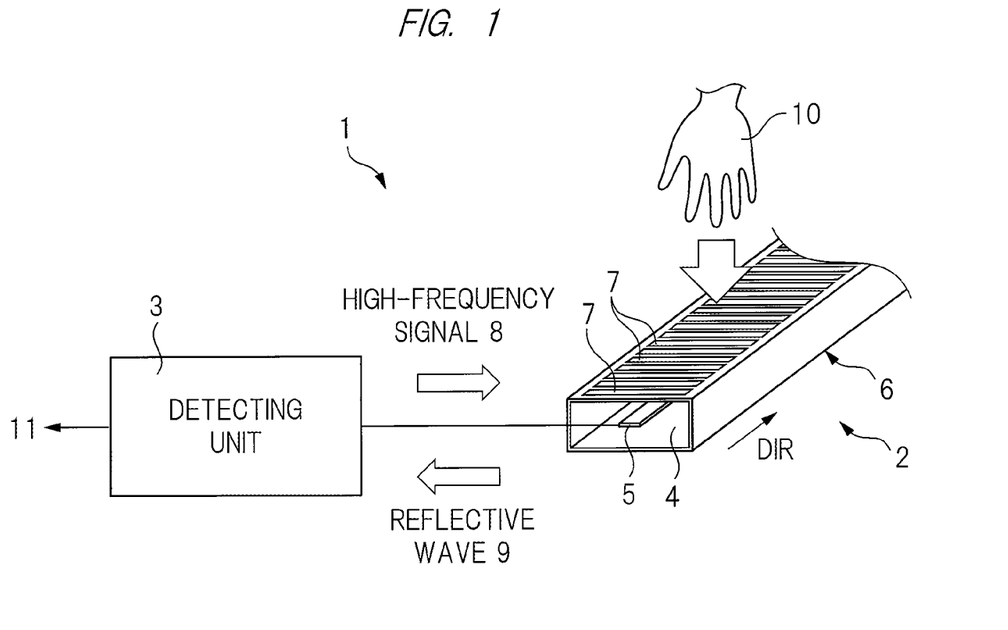
FIG. 1 is a block diagram showing a configuration of a detection device according to a first embodiment.

Firstly, explained will be outlines of a pinching sensor (hereinafter, also called "detected element") and a detection device according to a first embodiment. FIG. 1 is a block diagram showing a configuration of a detection device according to the first embodiment. The reference numeral 1 in FIG. 1 denotes a detection device. The detection device 1 includes a pinching sensor 2, and a detecting unit 3 connected to the pinching sensor 2.

Although not especially limited, the pinching sensor 2 includes: a linear-shaped conductor layer (hereinafter, also called "linear conductor layer" or "linear conductor portion") 5 extending along a direction DIR verging to a back side of the figure from a front side thereof; a dielectric layer (dielectric portion) 4 formed so as to surround the linear conductor layer 5; and a conductor layer (conductor portion) 6 formed so as to surround the dielectric layer 4. The conductor layer 6 extends in the direction DIR that is the same direction as that of the linear conductor layer 5. The linear conductor layer 5 is embedded in the dielectric layer 4, and is spaced apart from the conductor layer 6 so as to be electrically isolated (separated) from the conductor layer 6.

A plurality of slits 7 are arranged on an upper surface (top surface) of the conductor layer 6 along the direction DIR in which the conductor layer 6 extends. The conductor layer 6 has openings due to the slits, and the dielectric layer 4 is exposed from the openings. The pinching sensor 2 can be regarded as a transmission channel (path) having a stripline structure. When the pinching sensor 2 is regarded as such a channel, the linear conductor layer 5 can be regarded as a core line (core wire) of the transmission channel, and the conductor layer 6 having the plural slits arranged in the direction DIR in which the transmission channel extends can be regarded as an exterior conductor line disposed so as to encompass (sandwich) the core line in the transmission channel.

In the same figure, the reference numeral 10 denotes a detected object. The same figure illustrates a hand as the detected object 10. The hand is, of course, exemplified as an example of the detected object 10, and the detected object is not limited thereto.

The detecting unit 3 supplies a high-frequency signal(s) 8 to an input portion of the linear conductor layer 5 when detecting whether the detected object 10 is in proximity (vicinity) to or in contact with (hereinafter, called "proximity" including "contact") the pinching sensor 2. When the high-frequency signal 8 is supplied to the input portion of the linear conductor layer 5, a reflective wave 9 leads to being outputted from the input portion of the linear conductor layer 5 toward the detecting unit 3.

Figure 2:
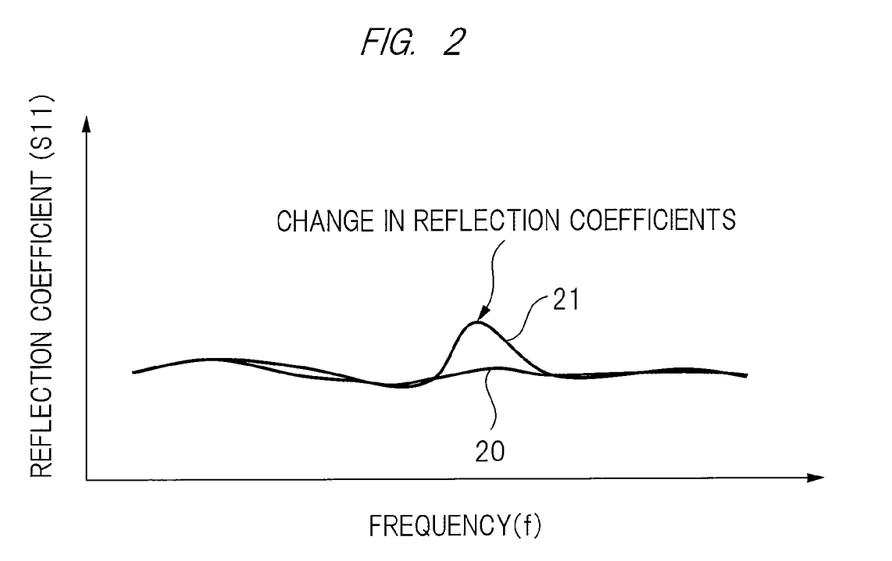
FIG. 2 is a characteristic diagram showing characteristics of a pinching sensor according to a first embodiment.

FIG. 2 is a characteristic diagram showing characteristics of the pinching sensor 2 according to the first embodiment. In the same figure, a lateral (horizontal) axis shows frequencies of the high-frequency signal 8, and a longitudinal (vertical) axis shows reflection coefficients (S11) based on a ratio of the high-frequency signal 8 and the reflective wave 9. Even when a frequency of the high-frequency signal 8 varies, for example, from a lower frequency to a higher frequency, the reflection coefficients (S11) are almost constant as shown by a characteristic curve 20 if the detected object 10 is not in proximity to the pinching sensor 2. In contrast thereto, if the detected object 10 is in proximity to the pinching sensor 2, the reflection coefficient significantly varies at a specular frequency as shown by a characteristic curve 21. The detecting unit 3 according to the first embodiment detects whether the reflection coefficient has varied (changed) and, upon detection of the variation, outputs a detection signal 11 indicating that the detected object 10 is in proximity thereto.

<Outline of Pinching Sensor>

Figure 3A:
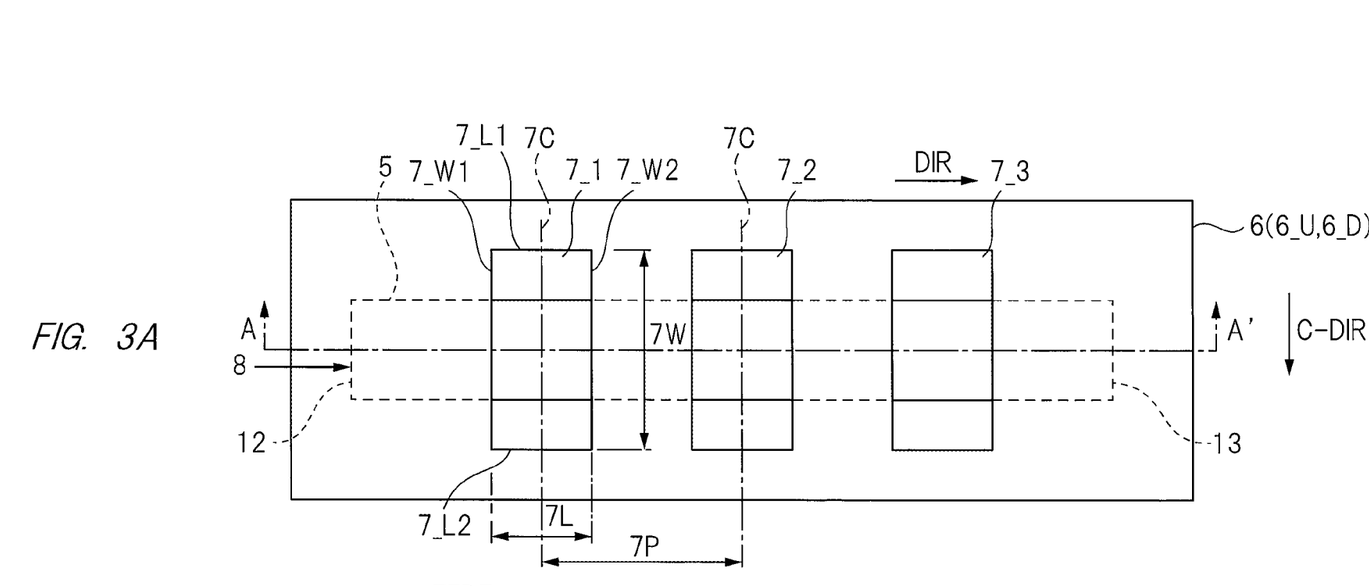
FIG. 3A is a plan view showing a configuration of the pinching sensor according to the first embodiment.
Figure 3B:
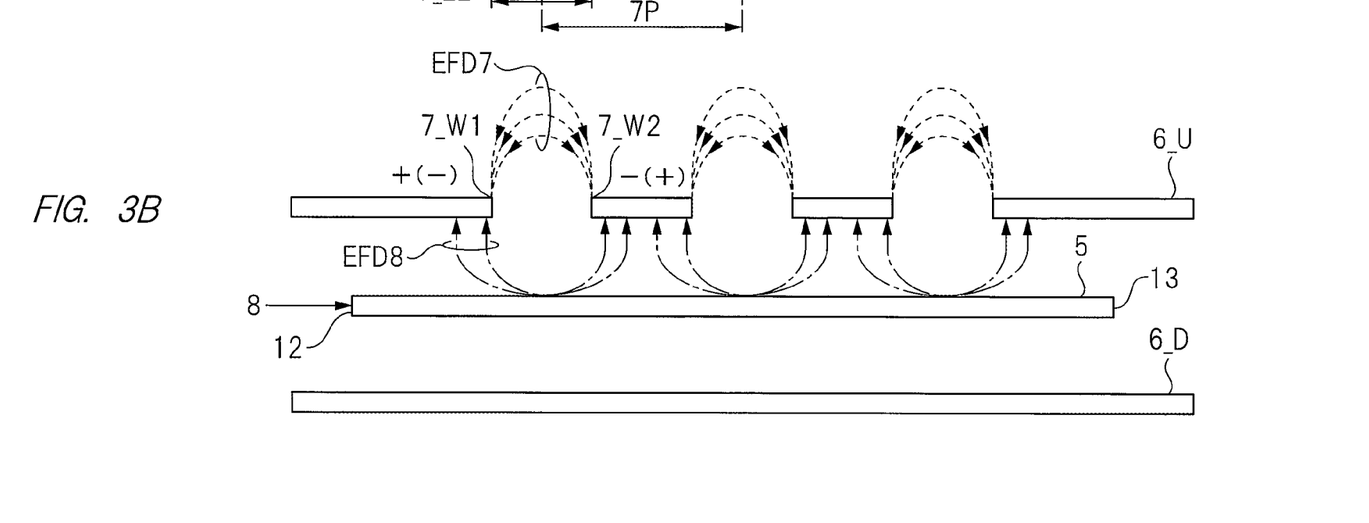
FIG. 3B is a sectional view showing the configuration of the pinching sensor according to the first embodiment.

Next, an outline of a pinching sensor according to the first embodiment will be explained. FIGS. 3A and 3B are a plan view and a sectional view each showing a configuration of the pinching sensor according to the first embodiment. Here, FIG. 3A shows a plan view of the pinching sensor 2, and FIG. 3B shows a section view taken along line A-A' of FIG. 3A.

The dielectric layer 6 includes an upper (front)-surface conductor layer (first conductor layer, first conductor portion) 6_U and a lower (back)-surface conductor layer (second conductor layer, second conductor portion) 6_D, which are formed so as to sandwich the linear conductor layer 5 embedded in the dielectric layer 4. The upper-surface conductor layer 6_U has a plurality of slits arranged along the direction IDR. In FIG. 3, three slits 7_1 to 7_3 are exemplified as the plural slits.

The slits 7_1 to 7_3 are configured by openings formed in (on) the upper-surface conductor layer 6_U. Consequently, the upper-surface conductor layer 6_U is not separated (divided) by the slits 7_1 to 7_3, and becomes one with respective surrounding portions of the slits 7_1 to 7_3. Although not especially limited, each of the slits 7_1 to 7_3 mutually has the same structure, so that the slit 7_1 will be explained as an example hereinafter.

A shape of the slit 7_1 is rectangular when viewed in a plane view. Long-side portions 7_W1, 7_W2 of the slit 7_1 each correspond to a width 7W of the slit 7_1, and short-side portions 7_L1, 7_L2 of the slit 7_1 each correspond to a length 7L of the slit 7_1. The slit 7_1 is formed so that center points of the long-side portions 7_W1, 7_W2 are overlapped with (are arranged on) a center line (coinciding with section line A-A' in the same figure) of the upper-surface conductor layer 6_U. Further, a pitch 7P between the slits corresponds to a distance between a center line 7C of the short-side portions 7_L1, 7_L2 of the slit 7_1 and a center line 7C of short-side portions of the slit 7_2 formed adjacently to the slit 7_1.

In the first embodiment, the short-side portions 7_L1, 7_L2 of each of the slits 7_1 to 7_3 are formed so as to extend along the direction DIR, and the long-side portions 7_W1, 7_W2 thereof are formed so as to extend along a direction C-DIR orthogonal to the direction DIR. The pitch 7P between the adjacent slits among the plural slits has the same value as that between other adjacent slits. That is, each of the slits is formed so that its long-side portion is orthogonal to the extending direction DIR of the pinching sensor 2 and its short-side portion extends in the same direction as the extending direction DIR of the pinching sensor 2. Meanwhile, no slit is formed on the lower-surface conductor layer 6_D as shown in FIG. 3B.

In the same figure, the reference numeral 12 denotes an input portion of the linear conductor layer 5, and 13 denotes an output portion of the linear conductor layer 5. In the first embodiment, the input portion 12 corresponds to one end of the linear conductor layer 5, and the output portion 13 corresponds to the other end of the linear conductor layer 5. When supplied to the input portion 12, the high-frequency signal 8 leads to propagating toward the output portion 13. The high-frequency signal 8 is reflected on the output portion 13, and its reflected wave leads to propagating in (along) the linear conductor layer 5 toward the input portion 12.

Propagation in the linear conductor layer 5 by the high-frequency signal 8 causes the linear conductor layer 5 to generate a magnetic field in which its positive or negative polarity alternately changes and to generate electric fields EFD8 that alternately change. The generation of the electric field EFD8, which alternately changes, brings generation of (positive and negative) potentials that alternately change at (around) an end of the slit 7_1, which brings generation of an electric field EFD7 around a portion (slit portion) of the slit 7_1. FIG. 3B exemplifies potentials and electric fields generated by the long-side portions 7_W1, 7_W2 of the slit 7_1. Herein, although the slit 7_1 is explained as an example, each of the other slits 7_2 to 7_3 also generates an electric field EFD7 at its slit portion similarly to the above.

When the dielectric detected object 10 is in proximity to, for example, the slit 7_1, the electric field EFD7 generated at the portion of the slit 7_1 is subjected to interference from (by) the detected object 10, which brings a change of the electric fields EFD7. The change in the electric field EFD7 further brings a change of the electric field generated by the linear conductor layer 5. Consequently, propagating characteristics of the linear conductor layer 5 vary, which leads to a change in the reflection coefficients. This makes it possible to detect the proximity of the detected object 10 by detecting the change of the reflection coefficient through the detecting unit 3 as shown in FIG. 1.

In FIG. 3, since no slit is formed on the lower-surface conductor layer 6_D, the propagating characteristics of the linear conductor layer 5 are unchanged even if the detected object 10 is in proximity to the lower-surface conductor layer 6_D, and so the detected object 10 is not detected. Herein, an example in which the slits are formed on the upper-surface conductor layer 6_U for detecting the detected object 10 on its upper surface is shown, but the present embodiment is not limited thereto. That is, slits may be formed on the lower conductor layer 6_D, and slits may be formed on both of the upper-surface and lower-surface conductor layers 6_U, 6_D. So long as slits are formed on at least one of the above conductor layers, a surface side(s) on which the slits are formed can detect the detected object 10.

When a wavelength of the high-frequency signal 8 is shorter in length than each size (each of the short-side portions 7_L1, 7_L2 and long-side portions 7_W1, 7_W2) of the slits 7_1 to 7_3, it is thought that the high-frequency signal 8 leaks as an electric wave(s) from the slits 7_1 to 7_3. Also in this case, when the detected object 10 is in proximity to the slit, variation of the reflection coefficients makes it possible to detect whether the detected object 10 is in proximity to the slit. However, since an undesired electric wave(s) is irradiated from the pinching sensor 2, each of the sizes of the slits 7_1 to 7_3 is desirably shorter in length than the wavelength of the high-frequency signal 8.

Incidentally, the lower-surface conductor layer 6_D may be connected to a predetermined voltage such as a ground voltage Vs, or may be in a floating state.

Next, explained will be a concrete example of the pinching sensor 2 and a concrete example of the detecting unit 3.

<First Concrete Example of Pinching Sensor>

Figure 4:
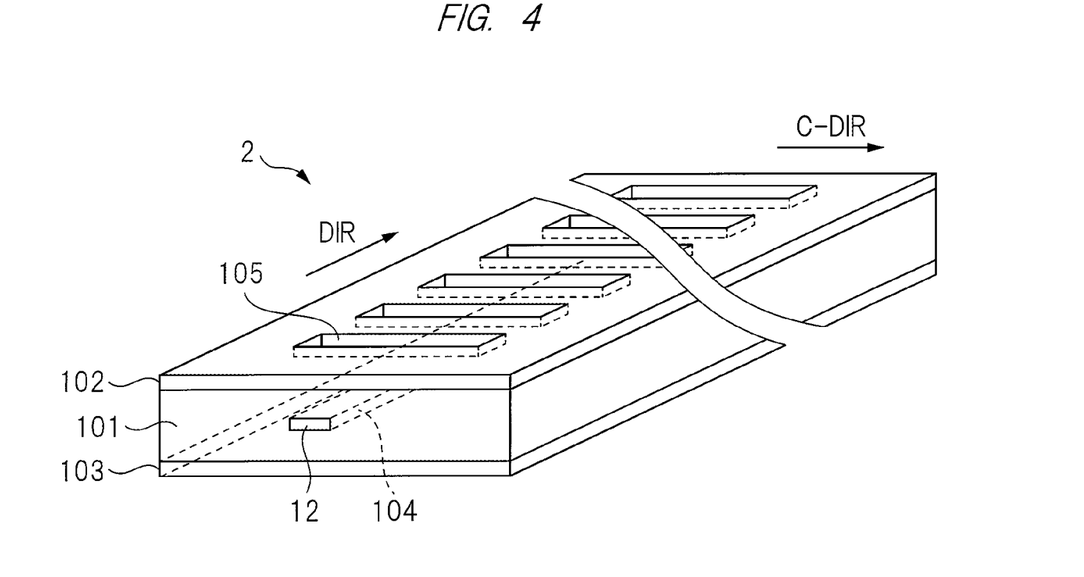
FIG. 4 is a perspective view showing the configuration of the pinching sensor according to the first embodiment.

FIG. 4 is a perspective view showing a configuration of the pinching sensor according to the first embodiment. The pinching sensor 2 includes: a dielectric layer 101: a front (top)-surface conductor layer 102; a back (bottom)-surface conductor layer 103 formed on a bottom surface of the dielectric layer 101; and a linear conductor layer 104 embedded inside the dielectric layer 101. In other words, the pinching sensor 2 includes: the linear conductor layer 104; the front-surface conductor layer 102 opposing the linear conductor layer 104; the back-surface conductor layer 103 opposing the linear conductor layer 104 and front-surface conductor layer 102; and a dielectric interposed between the linear conductor layer 104, front-surface conductor layer 102, and back-surface conductor layer 103. Further, formed as a slit(s) 105 on any of the front-surface and back-surface conductor layers 102, 103 is at least one or more openings. FIG. 4 shows an example in which a plurality of slits 105 are formed on (in) the front-surface conductor layer 102.

The plural slits formed on the front-surface conductor layer 102 each have the same structure. Each of the slits 105 has a rectangular shape when viewed in a plane view as explained in FIG. 3. When an example of a size of the slit 105 is mentioned, a length (7L) of a short-side portion (a length of the slit, corresponding to 7_L1, 7_L2 of FIG. 3) of the slit 105 extending along the direction DIR in which the pinching sensor 2 extends is 1 mm, and a length (7W) of a long-side portion (a width of the slit, corresponding to 7_W1, 7_W2 of FIG. 3) of the slit 105 arranged in a direction C-DIR orthogonal to the direction DIR is 15 mm. Further, a distance between a center line between the long-side portions (7_W1, 7_W2) in the slit and a center line therebetween in the adjacent slit thereto is 1.5 mm. That is, a pitch (corresponding to 7P of FIG. 3) between the slits is 2.5 mm.

<Measured Results>

By using as the detected object 10 a vessel filled with a phantom solution having the same dielectric constant (εr=approximately 38) as that of a human body model, a change in reflection coefficients was measured about a case in which the vessel is caused to be in proximity to (come close to) the pinching sensor 2 shown in FIG. 4 and a case in which the vessel is not caused to come close thereto. The vessel at this time has a size of: 15 mm in a length direction; 30 mm in a width direction; and 15 mm in a height direction.

Figure 5:
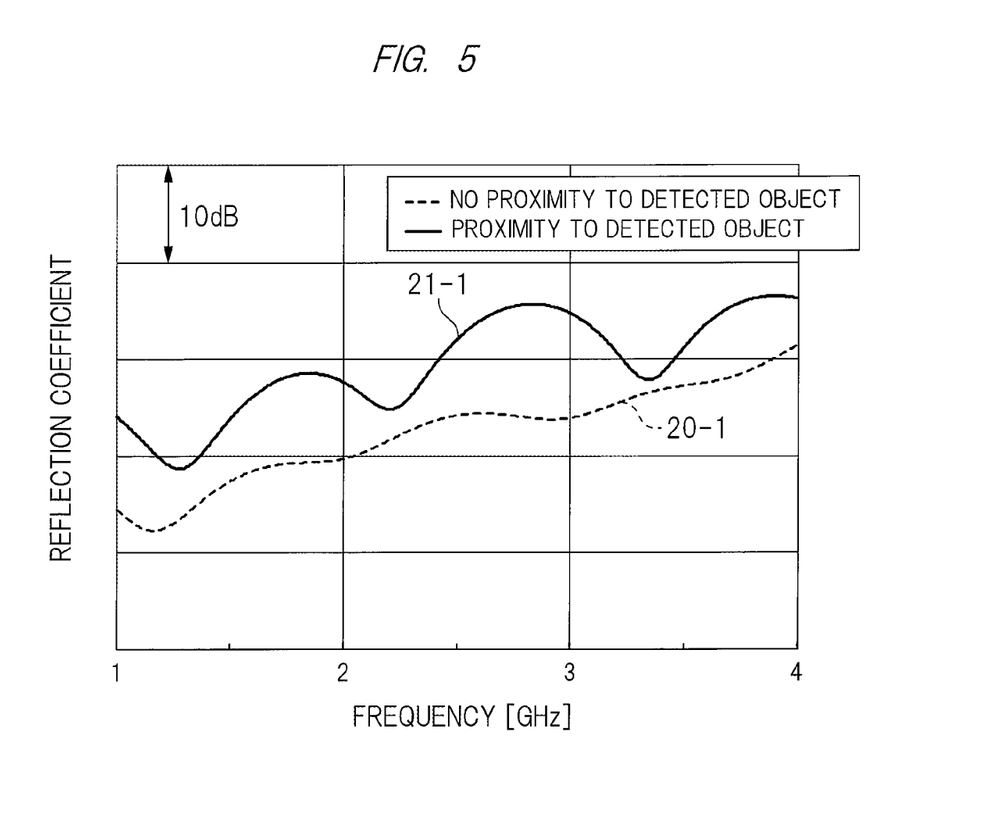
FIG. 5 is a characteristic diagram showing the characteristics of the pinching sensor according to the first embodiment.

FIG. 5 is a characteristic diagram showing results measured when the pinching sensor according to the first embodiment is used. In FIG. 5 similarly to FIG. 2, a lateral axis indicates frequencies of the high-frequency signal 8, and a longitudinal axis indicates reflection coefficients. Further, a curve 21-1 illustrated by a solid line of the same figure is a characteristic curve showing a change in the reflection coefficients when the above vessel is caused to come close to the pinching sensor 2 serving as the detected object 10, and a curve 20-1 illustrated by a broken line thereof is a characteristic curve showing a change in the reflection coefficients when the above vessel is not caused to come close to the pinching sensor 2.

When the vessel (detected object) is not caused to come close thereto, the reflection coefficient varies smoothly (gradually) as shown by the curve 20-1 with a rise of the frequency of the high-frequency signal 8. When the vessel is caused to come close thereto, the reflection coefficient increases with the rise of the frequency of the high-frequency signal 8. As shown by the curve 21-1, however, the reflection coefficient significantly varies up to about 3 dB when the frequency of the high-frequency signal 8 is in an ISM band of 2.4 GHz zone.

Figure 6:
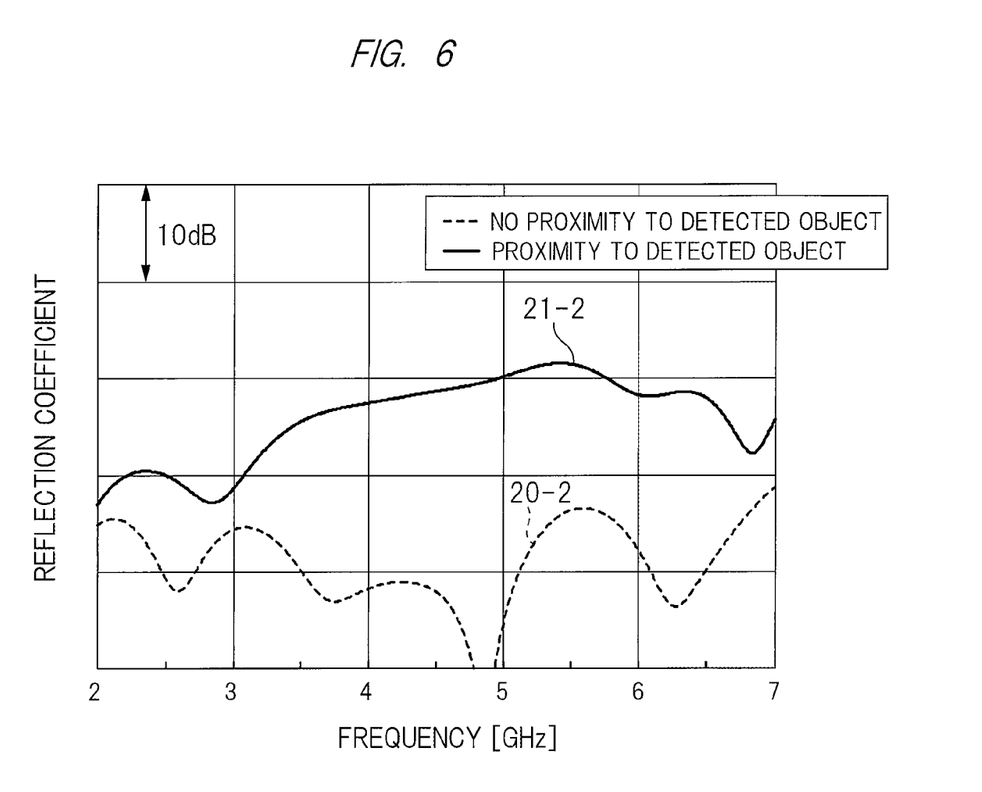
FIG. 6 is a characteristic diagram showing the characteristics of the pinching sensor according to the first embodiment.

Further, a change in reflection coefficients was measured under the condition that the length (7W) of the width (7_W1, 7_W2 of FIG. 3) of the above slit 105 is changed to 7.5 mm from 15 mm and that the other conditions (the length of each slit and the distance between the slits) are the same conditions as those as mentioned above. FIG. 6 is a characteristic diagram showing results measured when the length (7W) of the width of the slit 105 is set to 7.5 mm.

Also in FIG. 6, characteristics when the vessel (detected object) is caused to come close to the pinching sensor 2 are indicated by a solid line 21-2, and characteristics when the vessel is not caused to come close to the pinching sensor 2 are indicated by a broken line 20-2. As shown in FIG. 6, when the vessel is in proximity thereto, the reflection coefficient has a significant change of about 10 dB in an ISM band of 5 GHz zone.

Detection of the significant change in the reflection coefficients makes it possible to detect the proximity of the detected object 10 to the pinching sensor 2.

<Position Detection of Detected Object>

In the first embodiment, the plural slits 105 are arranged on the front-surface conductor layer 102 along the direction DIR in which the pinching sensor 2 extends. That is, the slits 105 are sequentially arranged along the direction DIR. The electric fields are generated around portions of the respective slits 105. However, the electric field(s) generated around the portion(s) of one or more slits, to which the detected object 10 comes close, among the generated electric fields is subjected to interference with (from) the detected object 10, thereby leading to be changed. Further, by the electric field generated around the linear conductor layer 104, the electric field generated at a position corresponding to a portion of the slit that is subjected to the interference from the detected object 10 and is changed is affected, which brings the change in the reflection coefficients. Therefore, the detection of the change in the reflection coefficients makes it possible to determinate the position to which the detected object 10 is in proximity.

Figure 7:
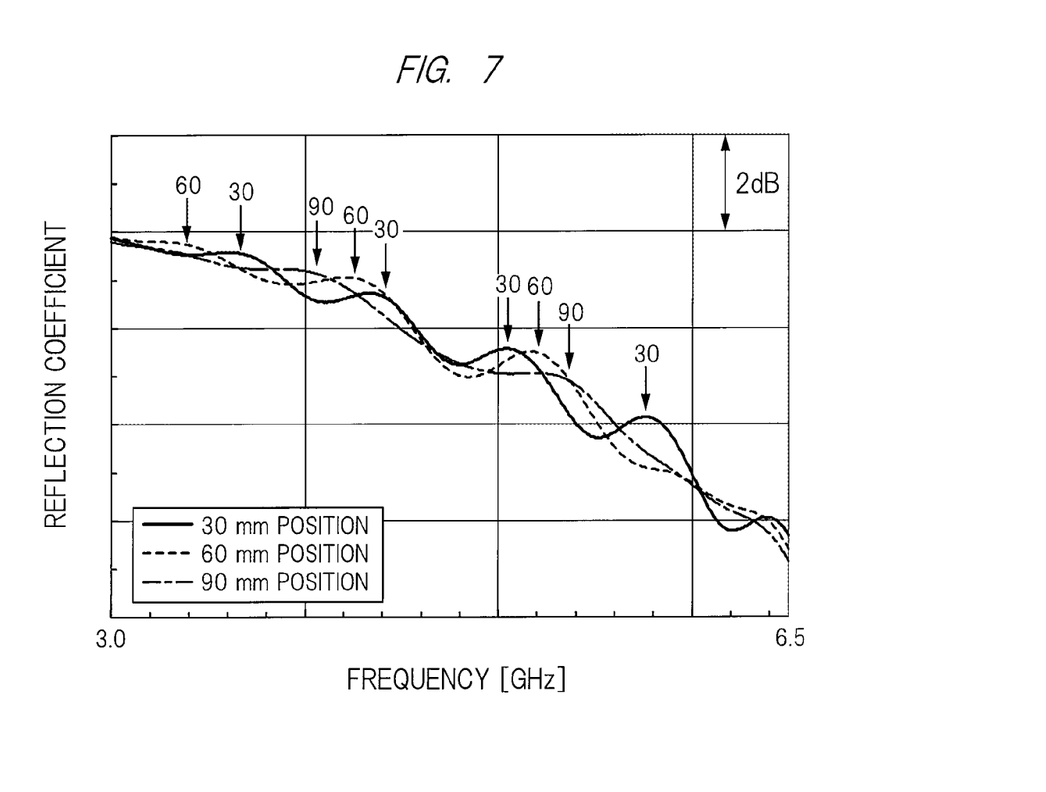
FIG. 7 is a characteristic diagram showing the characteristics of the pinching sensor according to the first embodiment.

FIG. 7 is a characteristic diagram showing characteristics of the pinching sensor 2 according to the first embodiment. Also in FIG. 7 similarly to FIG. 2, a lateral axis shows frequencies of the high-frequency signal 8, and a longitudinal axis shows reflection coefficients. In the same figure, a solid line is a characteristic curve showing a change in reflection coefficients when the vessel (detected object 10) is caused to come close to a position 30 mm apart from the input portion 12 of the linear conductor layer 104. Similarly, a broken line is a characteristic curve showing a change in reflection coefficients when the vessel is caused to come close to a position 60 mm apart from the input portion 12, and a dash-single-dot line is a characteristic curve showing a change in reflection coefficients when the vessel is caused to come close to a position 90 mm apart from the input portion 12. Those characteristic curves were obtained from the results measured by using the pinching sensor 2 as shown in FIG. 4.

In FIG. 7, arrows denoted by the reference numeral 30 show positions of frequencies, at which the reflection coefficients become crests, on the characteristic curve at the position 30 mm apart therefrom. Further, arrows denoted by the reference numeral 60 show positions of frequencies, at which the reflection coefficients become crests, on the characteristic curve at the position 60 mm apart therefrom, and arrows denoted by the reference numeral 90 show positions of frequencies, at which the reflection coefficients become crests, on the characteristic curve at the position 90 mm apart therefrom.

When the frequency of the high-frequency signal 8 is changed within a specific range (from 3.0 GHz to 6.5 GHz in figure), the number of crests and the number of troughs to which the reflection coefficients change (transition) are different from each other depending on the positions to which the vessel comes close as shown by FIG. 7. That is, in FIG. 7, the number of crests caused at the position 30 mm apart therefrom is four; the number of crests caused at the position 60 mm apart therefrom is three; and the number of crests caused at the position 90 mm apart therefrom is two.

The detecting unit 3 changes the frequency of the high-frequency signal 8 only within a predetermined range, and finds the number of crests and the number of troughs, to which the reflection coefficients change, within a range of the changed frequency. This causes the detecting unit 3 to determine the position, to which the detected object 10 comes close, by the pinching sensor 2 and to output the determined position as a detection signal 11. Further, also when the plural detected objects 10 are in proximity to the pinching sensor 2 substantially simultaneously, the detecting unit can determine each position of the detected objects.

<Configuration of Detecting Unit 3>

Figure 8:
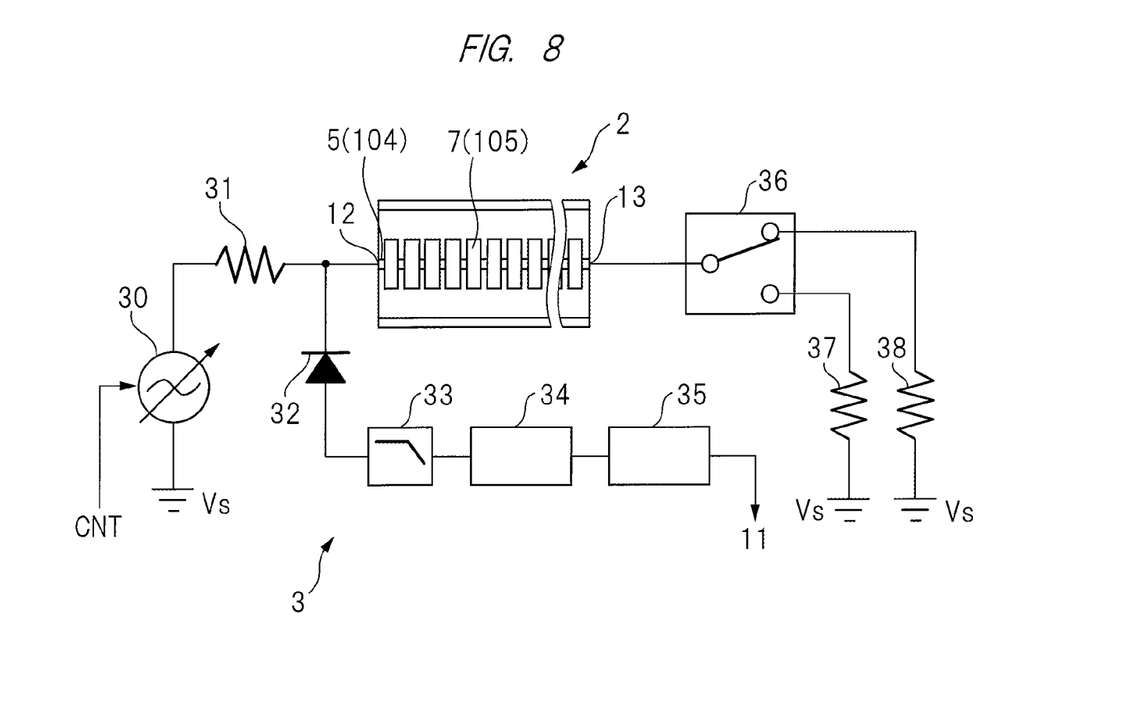
FIG. 8 is a block diagram showing the configuration of the pinching sensor according to the first embodiment.

FIG. 8 is a block diagram showing a configuration of the detection device according to the first embodiment. The configuration of the pinching sensor 2 will be omitted since being already explained. The detecting unit 3 includes a variable frequency generating circuit 30, an impedance matching resistance element 31, a diode (envelope detecting circuit) 32, a low-pass filter 33, an analog-digital converter circuit (hereinafter, called A/D converter circuit) 34, and an arithmetic circuit 35.

The variable frequency generating circuit 30 generates a high-frequency signal(s). A frequency of the generated high-frequency signal is variable. Although not especially limited, the variable frequency generating circuit 30 generates the high-frequency signal having a frequency depending on a control signal CNT. The generated high-frequency signal is supplied as a high-frequency signal 8 to the input portion 12 of the linear conductor layer 5 (104) via an impedance matching resistance element 31 that matches impedance between the variable frequency generating circuit 30 and the input portion 12. A cathode of the diode 32 is connected to the input portion 12 of the linear conductor layer 5 (104), and an anode of the diode 32 is connected to an input of the low-pass filter 33.

The diode 32 detects envelopes of a standing (stationary) wave. That is, a waveform (traveling wave) of the high-frequency signal 8 and a reflective wave 9 are mixed at the input portion 12. Switch of the frequency of the high-frequency signal 8 brings coincidence with the traveling wave and the reflective wave, and timing of generating the standing wave is generated. The diode rectifies (commutates) this standing wave to output the envelope(s) of the standing wave. The low-pass filter 33 outputs only a low-frequency component(s) contained in an output signal(s) from the diode. This leads to causing the low-pass filter 33 to output the envelope(s) of the standing wave from which a high-frequency component(s) is removed.

The A/D convertor circuit 11 converts, to a digital signal(s), the envelope(s) of the standing wave outputted from the low-pass filter 33, and supplies it to the arithmetic circuit 35. The arithmetic circuit 35 compares a value (digital value) of the supplied standing wave with, for example, a reference value, and outputs a detection signal(s)

11 indicating that the detected object 10 is detected when the value exceeds the reference value.

A phase of the reflective wave 49 varies depending on the change in the reflection coefficients. For this reason, the detecting unit 3 judges that the detected object 10 is detected when the traveling wave and the reflective wave coincide with each other and a large standing wave exceeding the reference value occurs. Similarly thereto, also when the position of the detected object 10 is detected, the detecting unit 3 changes the high-frequency signal 8 within a predetermined frequency range, and then measures the number of times of the large standing waves generated, thereby determining the position of the detected object 10. That is, the detecting unit 3 shown in FIG. 8 detects, as a change in the reflection coefficients of the input portion 12, a change in magnitudes (change in amplitudes) of the standing wave at the input portion 12. An example of detecting the change in the reflection coefficients has been explained based on the standing wave formed by mixture of the high-frequency signal 8 serving as a traveling wave and the reflective wave 7, but the detecting unit 3 may detect, as a change in reflection coefficients, a change in magnitudes (amplitudes) of a mixed wave formed by the above mixture.

In FIG. 8, the reference numerals 37 and 38 denote terminal resistance elements. The terminal resistance elements 37, 38 each are connected between a ground value Vs and a switch 36. The switch 36 performs selection of the terminal resistance elements 37, 38 and of no terminal resistance element. That is, the switch 36 sets the other end 13 of the linear conductor layer 5 (104) to any of an open state, a state of being connected to the terminal resistance element 37, and a state of being connected to the terminal resistance element 38. Although not especially limited, the terminal resistance element 37 has a value of 50Ω and the terminal resistance element 38 has a value of 5 KΩ.

The measurements of FIGS. 2 and 5-7 mentioned above have been made by using the detecting unit 3 shown in FIG. 8. For example, in measuring the characteristics shown by FIG. 5, the measurements were made by connecting the terminal resistance element 37 to the end 13 through the switch 36. In measuring the characteristics shown by FIG. 6, the measurements were made by connecting the terminal resistance element 38 to the end 13 through the switch 36. Further, in measuring the characteristics shown by FIG. 7, the switch 36 set the end 13 to the open state.

Incidentally, the detecting unit 3 may contain the above switch 36 and terminal resistance elements 37, 38.

First Modification Example

Figure 9:
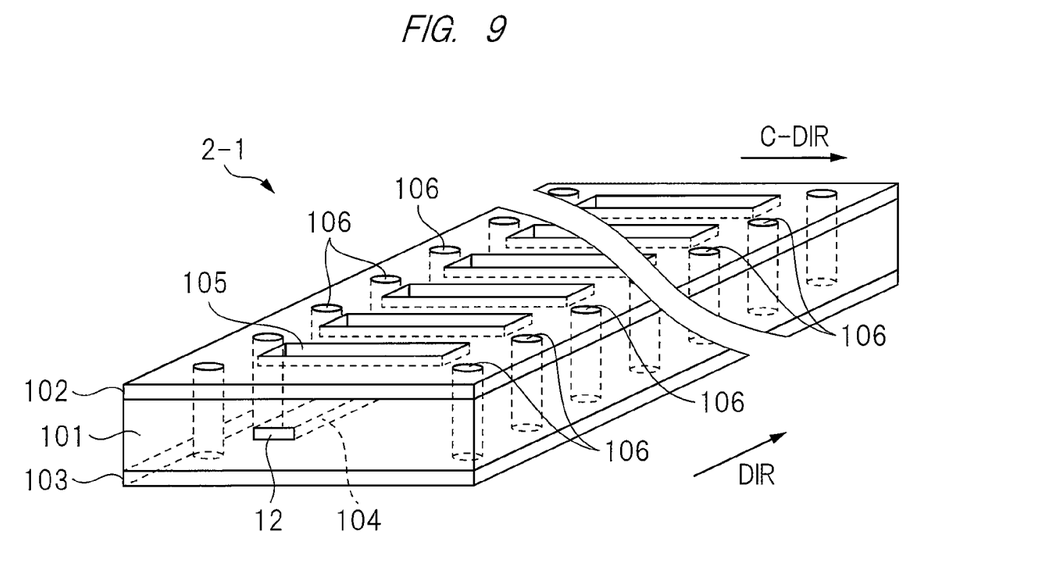
FIG. 9 is a perspective view showing a configuration of a pinching sensor according to a first modification example of the first embodiment.

FIG. 9 is a perspective view showing a configuration of a pinching sensor 2-1 according to a first modification example of the first embodiment. Since FIG. 9 is similar to FIG. 4, a difference therebetween will be mainly explained.

In a first modification example, a plurality of vias (via-holes) 106 penetrating a dielectric layer 101 are formed on and in the dielectric layer 101, and conductor layers are embedded in the vias 106. This brings electrical and mechanical connection between the upper-surface conductor layer 102 and the lower-surface conductor layer 103. By doing so, the pinching sensor 2 can be prevented from excessively deforming at a time of the pinching. Further, reduced can be a leakage of the electric field, which is generated around the linear conductor layer 104, from a side surface(s) of the pinching sensor 2.

An example of connecting the front-surface conductor layer 102 and the lower-surface conductor layer 103 by the conductor layer embedded in the vias 106 has been shown. However, adopted may be a configuration in which the side surface(s) of the pinching sensor 2 exposed from the dielectric layer 101 is covered with a side-surface conductor layer(s) and the upper-surface conductor layer 102 and the lower-surface conductor layer 103 are electrically and mechanically connected by the side-surface conductor layer.

Second Modification Example

Figure 10:
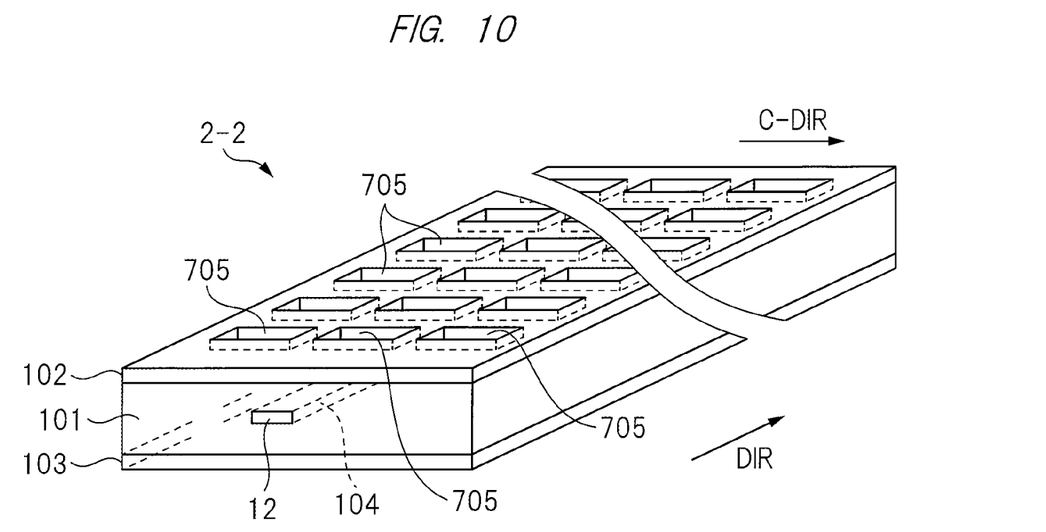
FIG. 10 is a perspective view showing a configuration of a pinching sensor according to a second modification example of the first embodiment.

FIG. 10 is a perspective view showing a configuration of a pinching sensor 2-2 according to a second modification example of the first embodiment. Since FIG. 10 is also similar to FIG. 4, a difference therebetween will be mainly explained.

In a second modification example, slits 705 include: slits (first slits) arranged on the upper-surface conductor layer 102 along the direction DIR in which a pinching sensor 2-2 extends; and slits (second slits) arranged on the upper-surface conductor layer 102 along the direction C-DIR orthogonal to the direction DIR. This makes it possible to prevent a length (7W) of a width (each of long-side portions 7_W1, 7_W2 in FIG. 3A) of one slit from being increased. Since the width of the one slit is reduced (shortened), the undesired high-frequencies can be prevented from being leaked from the slit even if the frequency of the high-frequency signal 8 is caused to rise.

In the above, an example of forming on (in) the conductor layer the plural slits mutually having the same size at the same pitch interval has been explained, but the second modification example is not limited thereto. That is, the number of slits may be one. Further, when the plural slits are formed on the conductor layer, sizes of the slits may be different from one another, and a pitch between the adjacent slits may be mutually different from a pitch between other adjacent slits. However, as shown by, for example, FIG. 4, when the plural slits are arranged along the direction DIR, it is desired to determine the size and pitch of the slit and the frequency of the high-frequency signal 8 so that the plural slits are located (fall) within a range of one wavelength of the high-frequency signal 8.

Second Embodiment

Figure 11:
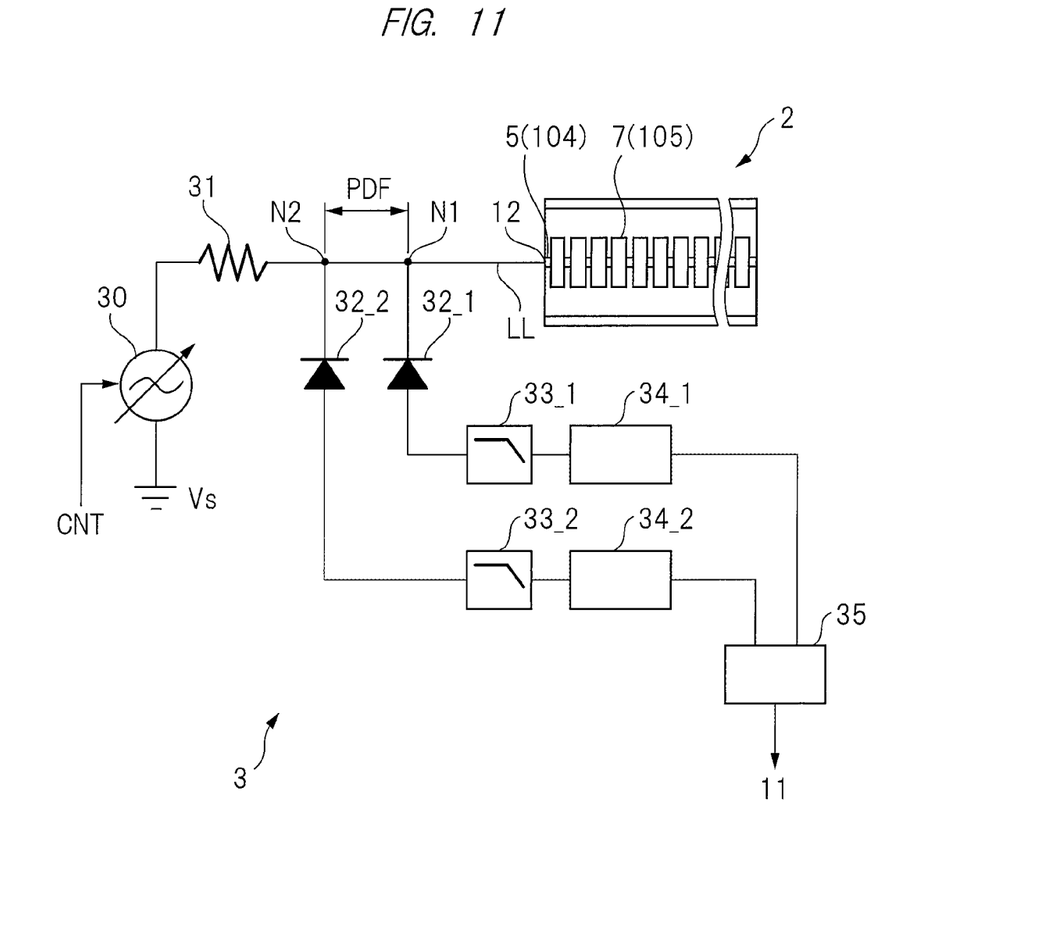
FIG. 11 is a block diagram showing a configuration of a pinching sensor according to a second embodiment.

A second embodiment provides a configuration of a detection device capable of determining each position of a plurality of detected objects when the plural detected objects come close to a pinching sensor substantially simultaneously. FIG. 11 is block diagram showing a configuration of a detection device according to a second embodiment. Since FIG. 11 is similar to FIG. 8, a difference therebetween will be mainly explained. Incidentally, the terminal resistance elements 37, 38 and switch 36 shown in FIG. 8 will be omitted in FIG. 11.

In the detection device shown by FIG. 11, a diode, a low-pass filter, and an A/D converter circuit are added to FIG. 8. In FIG. 11, the reference numerals 32_1, 33_1, 34_1 correspond to the diode 32, low-pass filter 33, and A/D converter circuit 34 explained in FIG. 8, respectively. A cathode of the diode 32_1 is connected to a connection point N1 which connects the input portion 12 and the impedance matching resistance element 31.

A cathode of the diode 32_2 added in the second embodiment is connected to a connection point N2 only a predetermined distance PDF apart from the connection point N1 on a wiring LL. The added low-pass filter 33_2 and A/D converter circuit 34_2 are connected between an anode of the diode 32_2 and an arithmetic circuit 35.

In the second embodiment, the diode 32_2 outputs an envelope of a standing wave having delay timing of only a predetermined distance PDF in comparison with the diode 32_2. Consequently, digital signals of two standing waves each having a phase difference corresponding to the predetermined distance PDF lead to being supplied to the arithmetic circuit 35.

For example, explained will be a case where two detected objects (hereinafter, called a first detected object and a second detected object) are in proximity to the pinching sensor substantially simultaneously. Since a position where the first detected object is in proximity thereto is different from a position where the second detected object is in proximity thereto, periodic characteristics of a standing wave caused by the first detected object are different from periodic characteristics of a standing wave caused by the second detected object. This makes it possible to detect the number of detected objects being plural. Further, a phase difference between the standing wave detected at the connection point N1 and the standing wave detected at the connection point N2 makes it possible to determine the positions of the respective detected objects. The arithmetic circuit 35 performs such a processing by an operation, and outputs the detection signal 11.

Incidentally, Patent Document 3 discloses a distance measuring device obtaining a distance by an electric wave(s) through detection of two standing waves. However, Patent Document 3 does not disclose generation of an electric field(s) by using a slit(s), and detection of a detected object and determination of its position from a change in reflection coefficients.

<Calibration>

In the first and second embodiments, the proximity of the detected object is detected by a change amount (variation) of reflection coefficients. It is desirable to perform calibration for determining judgement of the proximity of the detected object depending on how the reflection coefficient changes. That is, before actual use of the detection device 1, the detected object is moved to the pinching sensor 2 up to a position which is judged as proximity, and a change amount of reflection coefficients at this time is set as a reference. In actually using the detection device 1, the detection of the detected object is made so as to be judged when the reflection coefficient exceeds the change amount of the reference. That is, the reference of the reflection coefficient needs to be previously found by the calibration.

If the detecting unit 3 shown by FIG. 8 is used as an example, the reference for the reflection coefficient is found as follows. Before actual use of the detection device 1, the calibration is performed. In a process of the calibration, the detected object is moved up to a position judging that the detected object is in proximity thereto, the frequency of the high-frequency signal 8 is varied, and a digital value corresponding to a standing wave is found as a reference value and is held (kept). The held reference value is set at (to) the arithmetic circuit 35, and the arithmetic circuit 35 compares the reference value set at the arithmetic circuit 35 and a digital value obtained from the A/D converter circuit 43 before the actual use.

Applied Example

Figure 12:
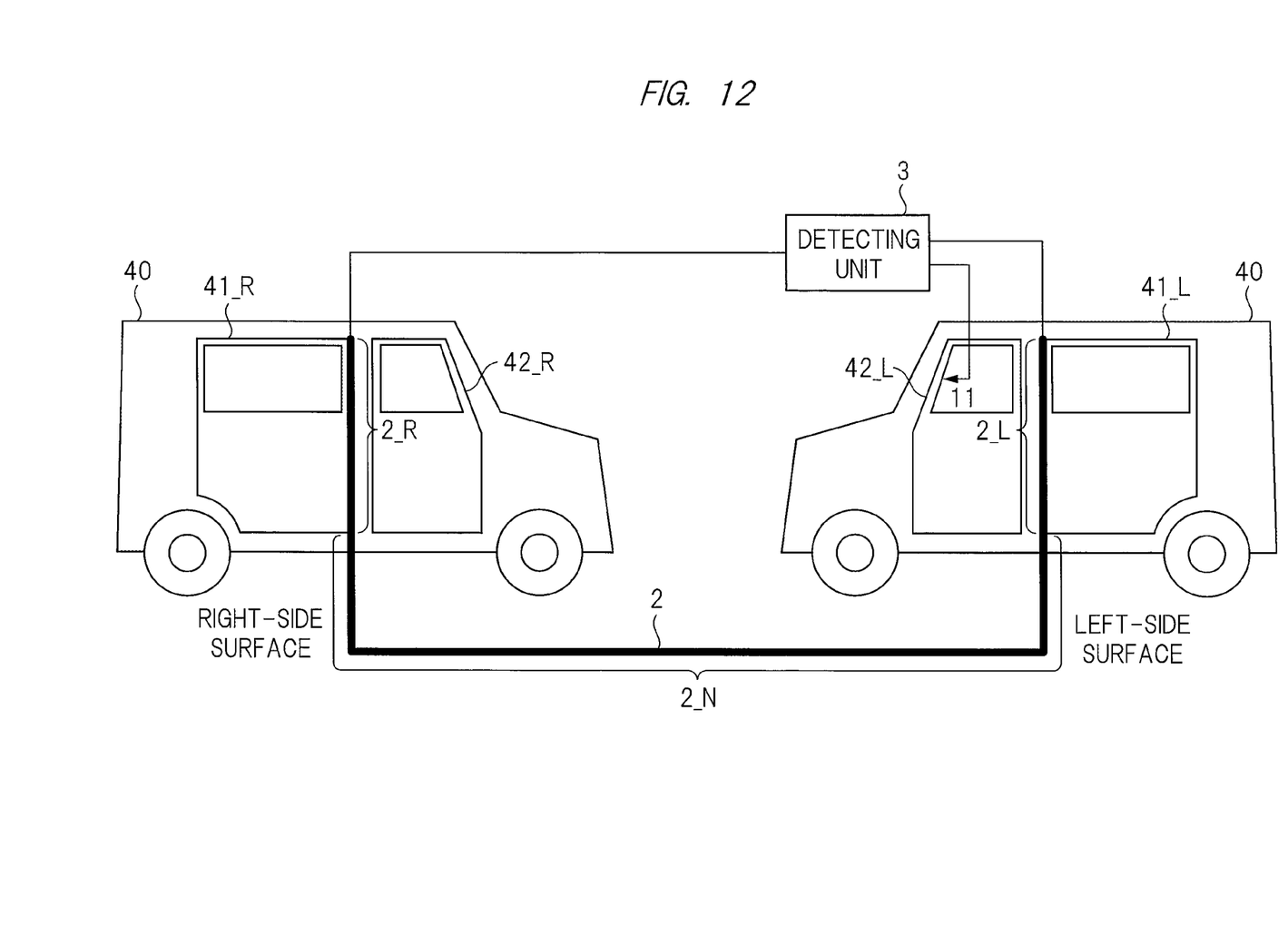
FIG. 12 is an explanatory diagram for explaining an automobile mounting the detection devices according to the first and second embodiments.

Next, explained will be an applied example of using the detection device 1 explained in the first and second embodiments. Herein, explained will be an example of mounting the detection device 1 onto an automobile. FIG. 12 is an explanatory diagram for explaining an automobile mounting the detection device according to the first and second embodiments.

In FIG. 12, the reference numeral 12 denotes an automobile. A left side of the figure illustrates a right-side surface of the automobile 40, and a right side of the figure illustrates a left-side surface of the automobile 40. One transmission channel (path) is located (installed) as one body of the pinching sensor 2 at a right rear door 41_R of the automobile 40 and a left rear door 41_L of the automobile 40. In this case, the one body of the pinching sensor 2 has: a sensor portion 2_R, 2_L in which the slits are formed; and a transmission channel portion 2_N in which no slit is formed. The sensor portion 2_R is located at the corresponding right rear door 41_R, and the sensor portion 2_L is located at the corresponding left rear door 41_L. The transmission channel portion 2_N is a portion electrically connecting the sensor portions 2_R and 2_L, and is laid in a vehicle of the automobile 40.

Before a human body etc. are pinched by at least any of the right rear door 41_R and the left rear door 41_L, the detecting unit 3 detects as detected objects the human body etc., and notifies a driver of the detection by the detection signal 11.

According to the first and second embodiments, by a change in capacitance, the transmission channel having less loss can be used as the pinching sensor 2 instead of detecting the detected object. Such use makes it possible to use the one body of the pinching sensor 2 common to right and left doors. Further, according to the first and second embodiments, since determination of the position of the detected object is also possible, determination of a possibility that the pinching will occur at any of the rear doors can be made also by using the one body of the pinching sensor.

Further, not the slit but the transmission channel portion is formed in a range (portion) in which the detection of the detected object is unnecessary, so that an unnecessary notification(s) can be prevented from being made to the driver.

Additionally, the above one body of the pinching sensor 2 may also be located at (installed in) doors 42_R, 42_L on driver's seat and passenger's seat sides.

In the foregoing, the invention made by the inventors of the present invention has been concretely described based on the embodiments. However, it is needless to say that the present invention is not limited to the foregoing embodiments and various modifications and alterations can be made within a range not departing from the gist (scope) of the present invention. For example, FIG. 4 etc. illustrate the case of the linear conductor layer whose section is rectangular, but the linear conductor layer may have a circular or oval section.

What is claimed is:

1. A pinching sensor comprising:
   a linear conductor portion extending; and
   a first conductor portion extending in an extension direction of the linear conductor portion, opposing the linear conductor portion, and having a plurality of slits arranged in the extension direction,
   wherein supply of a high-frequency signal to the linear conductor portion generates an electric field around each portion of the plural slits, and a change of the electric field caused by interference with a detected object changes a reflection coefficient of the linear conductor portion.

2. The pinching sensor according to claim 1, comprising a second conductor portion extending in the extension direction and opposing the first conductor portion,
   wherein the linear conductor portion is sandwiched between the first and second conductor portions in a state of separating the first and second conductor portions from each other.

3. The pinching sensor according to claim 2, wherein no slit is placed in the second conductor portion.

4. The pinching sensor according to claim 3, wherein a dielectric layer is provided between the first and second conductor portions, the linear conductor portion is embedded in the dielectric layer, and the dielectric layer is exposed from the slits.

5. A detection device comprising:
   a detected element including:
      a dielectric layer, a linear conductor layer being formed on the dielectric layer;
      conductor layers arranged on top and bottom surfaces of the dielectric layer; and
      a transmission channel, a slit being formed in the transmission channel and on at least one of the conductor layers arranged on the top and bottom surfaces; and
   a detecting unit supplying a high-frequency signal to an input portion of the linear conductor layer, generating an electric field around a slit portion of the conductor layer on which the slit is formed, and detecting a change in a reflection coefficient of at input portion, the change being caused by a change in the electric field generated by interference with a detected object.

6. The detection device according to claim 5,
   wherein the transmission channel has as the slit a plurality of slits composed of the slit,
   the plural slits extend along an extension direction of the linear conductor layer, and have a plurality of first slits formed on the conductor layer.

7. The detection device according to claim 6,
   wherein the conductor layers arranged on the top and bottom surfaces are electrically connected to each other.

8. The detection device according to claim 6,
   wherein the plural slits have a plurality of second slits formed in a direction orthogonal to the extension direction of the linear conductor layer.

9. The detection device according to claim 5,
   wherein the detecting unit detects standing waves mutually different in a phase at the input portion.

10. The detection device according to claim 9,
    wherein the detecting unit includes a wiring connected to the input portion, and an envelope detecting circuit detecting envelopes of standing waves at a plurality of connection points mutually different in a position on the wiring.

11. The detection device according to claim 6,
    wherein the transmission channel is common to a plurality of doors of a vehicle, and the plurality of first slits are formed at portions corresponding to the respective doors on the transmission channel.

12. The detection device according to claim 5,
    wherein the change in the reflection coefficient is judged based on a reference found by a calibration.

* * * * *